United States Patent
Zhang et al.

(10) Patent No.: US 9,991,867 B2
(45) Date of Patent: Jun. 5, 2018

(54) PIEZOELECTRIC ACOUSTIC RESONATOR WITH ADJUSTABLE TEMPERATURE COMPENSATION CAPABILITY

(71) Applicants: ZTE CORPORATION, Shenzhen, Guangdong Province (CN); TIANJIN UNIVERSITY, Tian Jin (CN)

(72) Inventors: Hao Zhang, Tianjin (CN); Liangzhen Du, Shenzhen (CN); Wei Pang, Tianjin (CN); Jianbang Li, Shenzhen (CN); Nianchu Hu, Tianjin (CN); Kai Kang, Shenzhen (CN)

(73) Assignees: ZTE Corporation, Shenzhen, Guangdong (CN); TIANJIN University, Tianjin (CN)

( * ) Notice: Subject to any disclaimer, the term of this patent is extended or adjusted under 35 U.S.C. 154(b) by 467 days.

(21) Appl. No.: 14/425,076

(22) PCT Filed: Aug. 21, 2013

(86) PCT No.: PCT/CN2013/081943
§ 371 (c)(1),
(2) Date: Mar. 2, 2015

(87) PCT Pub. No.: WO2013/185737
PCT Pub. Date: Dec. 19, 2013

(65) Prior Publication Data
US 2015/0263697 A1    Sep. 17, 2015

(30) Foreign Application Priority Data
Aug. 30, 2012  (CN) .......................... 2012 1 0314229

(51) Int. Cl.
*H03H 9/02* (2006.01)
*H01L 41/047* (2006.01)
*H01L 41/18* (2006.01)

(52) U.S. Cl.
CPC ..... *H03H 9/02102* (2013.01); *H01L 41/0477* (2013.01); *H01L 41/18* (2013.01); *H01L 41/183* (2013.01)

(58) Field of Classification Search
CPC .............. H03H 9/02102; H03H 9/0504; H01L 41/0477; H01L 41/18; H01L 41/183; G04F 5/06
(Continued)

(56) References Cited

U.S. PATENT DOCUMENTS 3,590,287 A *  6/1971  Berlincourt .......... H03H 9/0207
                                                      310/321
4,456,850 A    6/1984  Inoue et al.
(Continued)

FOREIGN PATENT DOCUMENTS

CN          1801613 A     7/2006
CN        102904546 A     1/2013
(Continued)

OTHER PUBLICATIONS

NPL of GB 1149569, abstract, Stephen.*
(Continued)

*Primary Examiner* — Bryan Gordon
(74) *Attorney, Agent, or Firm* — Ling Wu; Stephen Yang; Ling and Yang Intellectual Property

(57) ABSTRACT

A piezoelectric acoustic resonator with an adjustable temperature compensation capability is disclosed. The piezoelectric acoustic resonator includes: a piezoelectric acoustic reflection structure, a first electrode, a second electrode, a piezoelectric layer between the first electrode and the second electrode, and a temperature compensation layer; wherein the temperature compensation layer is a single-layer temperature compensation layer formed of $Si_xO_y$ material, or a composite temperature compensation layer formed by stack-
(Continued)

ing material with a positive temperature coefficient of sound velocity and material with a negative temperature coefficient of sound velocity; and the temperature compensation layer is configured to: perform reverse compensation for a temperature frequency shift caused by the first electrode, the piezoelectric layer and the second electrode in the piezoelectric acoustic resonator; wherein x:y is not equal to 1:2.

8 Claims, 5 Drawing Sheets

(58) Field of Classification Search
USPC .......................................... 310/346, 321, 350
See application file for complete search history.

(56) References Cited

U.S. PATENT DOCUMENTS

| | | | |
|---|---|---|---|
| 8,085,117 B1 | 12/2011 | Abbott et al. | |
| 8,330,325 B1* | 12/2012 | Burak | H03H 9/585 310/320 |
| 2006/0103486 A1 | 5/2006 | Ruile et al. | |
| 2006/0158283 A1* | 7/2006 | Hikita | H03H 9/02102 333/187 |
| 2007/0120625 A1 | 5/2007 | Larson, III et al. | |
| 2010/0225201 A1 | 9/2010 | Roesler et al. | |
| 2011/0266925 A1 | 11/2011 | Ruby et al. | |
| 2011/0273061 A1 | 11/2011 | Thalmayr et al. | |
| 2013/0207515 A1* | 8/2013 | Taniguchi | H03H 9/02102 310/321 |
| 2014/0292149 A1* | 10/2014 | Zou | G10K 9/122 310/335 |
| 2015/0318837 A1* | 11/2015 | Zou | H03H 9/02102 333/187 |

FOREIGN PATENT DOCUMENTS

| | | | |
|---|---|---|---|
| GB | 1149569 | * | 4/1969 |
| JP | 2005051447 A | | 2/2005 |
| JP | 2008182512 A | | 8/2008 |
| JP | 2009524955 A | | 7/2009 |
| JP | 2010016481 A | | 1/2010 |
| JP | 2010278830 A | | 12/2010 |
| WO | 2007138844 A | | 12/2007 |
| WO | 2011086986 A | | 7/2011 |

OTHER PUBLICATIONS

XP004396839; Non-contact sound velocities and attenuation measurements of several ceramics at elevated temperatures; K.J. Singh et al. Tsukuba, Japan; Jun. 20, 2002.

XP031195050; Temperature Coefficient Measured by Picosecond Ultrasonics on Materials in Thin Films for Bulk Acoustic Wave Technology; P.Emery, D. Petit et al. France; 2007, IEEE Ultrasonics Symposium.

XP032216968; A New BAWR(Bulk Acoustic Wave Resonator) Structure for Near Zero TCF(Temperature Coefficient of Frequency); Future IT Center, Samsung Advanced Institute of Technology (SAIT), Young-in, Gyeong-gi 44672, Republic of Korea.

Non-stoichiometric silicon oxide deposited at low gaseous N2O/SiH4 ratios; Thin Solid Films, Elsevier-Sequoia S.A. Lausanne, CH, Jul. 1, 2004, pp. 220-223. XP004513178A.

Temperature Compensated Bulk Acoustic Thin Film Resonators; K.M. Lakin, K.T. McCarron and J. F. McDonald. XP010541721A.

* cited by examiner

PIEZOELECTRIC ACOUSTIC RESONATOR WITH ADJUSTABLE TEMPERATURE COMPENSATION CAPABILITY

TECHNICAL FIELD

The present document relates to the field of technology of electronic component, and particularly, to a piezoelectric acoustic resonator with an adjustable temperature compensation capability.

BACKGROUND OF THE RELATED ART

With the rapid popularization of wireless communication devices, the demand for a high frequency filter with small size, low mass and good performance is growing, and a piezoelectric acoustic filter made on silicon wafer has been widely accepted by the market. Piezoelectric acoustic resonators constituting such high-performance filter mainly include Film Bulk Acoustic Resonators (FBAR) and Solid Mounted Resonators (SMR).

The resonant frequency of a piezoelectric acoustic resonator is decided by thickness of each layer in a propagation path and the sound velocity of a longitudinal sound wave in each layer. The resonant frequency is mainly affected by thickness of a piezoelectric layer and the sound velocity of the piezoelectric layer. Thicknesses of two electrodes and the sound velocity within the two electrodes also affect the resonant frequency greatly. Effect of an acoustic reflector constituted by the cavity on the resonant frequency can be ignored, for the acoustic reflector can reflect almost all of acoustic energies back to the piezoelectric layer. If the acoustic reflector is constituted by alternate arrangement of a high acoustic impedance layer and a low acoustic impedance layer, the top layer of the reflector will contain a small part of acoustic energies, so that the function of the reflector will be contributed to the resonant frequency to some extent.

Thicknesses of the piezoelectric layer, metal or dielectric layer of the piezoelectric acoustic resonator and the sound velocity within the piezoelectric layer, metal or dielectric layer are all changed with the temperature, thus the resonant frequency of the piezoelectric acoustic resonator is also changed with the temperature. Though thickness expansion or shrinkage generated from the change with the temperature in each layer will affect the resonant frequency, the change of an acoustic wave propagation velocity with the temperature within each layer is the main factor to affect the resonant frequency of the piezoelectric acoustic resonator to be changed with the temperature. At present, most of materials applied in the piezoelectric acoustic resonator present a negative temperature coefficient of sound velocity, that is, the sound velocity will decrease with the rise of temperature, for the materials will be "softened" at a higher temperature (e.g., the across-atomic force is weakened). The decrease of the across-atomic force will cause the decrease of a material elastic coefficient, thereby lowering the sound velocity. For example, a temperature coefficient of sound velocity of Aluminum Nitride (AlN) is −25 ppm/° C., and a temperature coefficient of sound velocity of Molybdenum (Mo) is −60 ppm/° C.

Generally a Radio Frequency (RF) filter constituted by the piezoelectric acoustic resonator has a passband frequency response, the Temperature Coefficient of Frequency (TCF) of the piezoelectric acoustic resonator will reduce the manufacturing yield rate of the RF filter, for devices or components constituted by the piezoelectric acoustic resonator can only meet requirements of the passband bandwidths within a certain temperature range. In most of the required applications of duplexer, in order to still meet the requirement within a very wide temperature range, a low temperature coefficient of frequency is very important. A high stable oscillator containing the piezoelectric acoustic resonator has more strict requirements on the temperature coefficient of frequency of the piezoelectric acoustic resonator, and the temperature coefficient of frequency is required to be extremely low or approximate to zero, for most of oscillators are used to provide reference signals or timing signals, and it demands that the change of temperature exerts tiny influence on these signals.

In order to obtain a low temperature coefficient of frequency, a common method is to add one layer of silicon dioxide ($SiO_2$), materials of temperature compensation layer, in a stacked structure of the piezoelectric acoustic resonator. Major materials forming the stacked structure of the piezoelectric acoustic resonator all have a negative temperature coefficient of sound velocity, but the $SiO_2$ materials have a positive temperature coefficient of sound velocity, and by adjusting thicknesses of the $SiO_2$ and materials of all other layers in the stacked structure, the drift of the frequency of the piezoelectric acoustic resonator with the temperature can be effectively reduced in certain filter applications. However, it is required that the resonant frequency of the piezoelectric resonator, a electromechanical coupling coefficient, a resonator quality factor and the temperature coefficient of frequency of the resonator meet certain requirements simultaneously in some other filter applications, which is hard to be achieved by simply adjusting the thickness of each layer in the stacked structure of the resonator. Therefore, how to implement a temperature compensation capability that can adjust the materials of the temperature compensation layer at present, that is, adjusting the temperature coefficient of sound velocity of the materials of the temperature compensation layer, so that the process of designing a resonator have a stronger flexibility, has become a technical problem required to be solved urgently at present.

SUMMARY OF THE INVENTION

The embodiments of the present invention provide a piezoelectric acoustic resonator with an adjustable temperature compensation capability, to solve a problem that a temperature coefficient of sound velocity of the compensation layer cannot be adjusted with the temperature compensation method adopted in the related art, thereby providing flexible design parameters for the piezoelectric acoustic resonator.

The embodiment of the present invention provides a piezoelectric acoustic resonator with an adjustable temperature compensation capability, which comprises: a piezoelectric acoustic reflection structure, a first electrode, a second electrode, a piezoelectric layer between the first electrode and the second electrode, and a temperature compensation layer; wherein the temperature compensation layer is a single-layer temperature compensation layer formed of $Si_xO_y$ material, or a composite temperature compensation layer formed by stacking material with a positive temperature coefficient of sound velocity and material with a negative temperature coefficient of sound velocity; and the temperature compensation layer is configured to: perform reverse compensation for a temperature frequency shift caused by the first electrode, the piezoelectric layer and the second electrode in the piezoelectric acoustic resonator; wherein x:y is not equal to 1:2.

Alternatively, in the piezoelectric acoustic resonator, when the temperature compensation layer is the single-layer temperature compensation layer formed of the $Si_xO_y$ material, a temperature coefficient of sound velocity of the temperature compensation layer increases with an increase of an oxygen ratio in $Si_xO_y$ and decreases with an increase of a silicon ratio in $Si_xO_y$; and when the temperature compensation layer is the composite temperature compensation layer formed by stacking the material with the positive temperature coefficient of sound velocity and the material with the negative temperature coefficient of sound velocity, the temperature coefficient of sound velocity of the temperature compensation layer increases with an increase of thickness of the material with the positive temperature coefficient of sound velocity and decreases with an increase of thickness of the material with the negative temperature coefficient of sound velocity.

Alternatively, in the piezoelectric acoustic resonator, when the temperature compensation layer is the composite temperature compensation layer formed by stacking the material with the positive temperature coefficient of sound velocity and the material with the negative temperature coefficient of sound velocity, the material with the positive temperature coefficient of sound velocity in the temperature compensation layer is $SiO_2$, and the material with the negative temperature coefficient of sound velocity is dielectric or metal material.

Alternatively, in the piezoelectric acoustic resonator, an arrangement mode of the temperature compensation layer is one of the following modes:

the temperature compensation layer is arranged between the piezoelectric acoustic reflection structure and the first electrode;

the temperature compensation layer is arranged between the first electrode and the piezoelectric layer;

the temperature compensation layer is arranged between the piezoelectric layer and the second electrode; and the temperature compensation layer is arranged on the second electrode.

Alternatively, in the piezoelectric acoustic resonator, the temperature compensation layer is made through a film deposition technique.

Alternatively, in the piezoelectric acoustic resonator, the first electrode and the second electrode use the same or different metal materials;

the metal materials comprise: Au, W, Mo, Pt, Ru, Ir, TiW, Al or Ti.

Alternatively, in the piezoelectric acoustic resonator, the piezoelectric layer uses one of the following materials: aluminum nitride (AlN), zinc oxide (ZnO), piezoelectric ceramics (PZT), lithium niobate (LiNbO3), potassium niobate (KNbO3) or lithium tantalate (LiTaO3).

In the technical scheme of the embodiments of the present invention, by adjusting the temperature coefficient of sound velocity of the materials of the temperature compensation layer, or with the method for adjusting the temperature compensation capability of the materials of the temperature compensation layer through the composite temperature compensation layer formed by stacking the material with the positive temperature coefficient of sound velocity and the material with the negative temperature coefficient of sound velocity, so that the process of designing a resonator has a stronger flexibility.

PREFERRED EMBODIMENTS OF THE INVENTION

Figure 1:
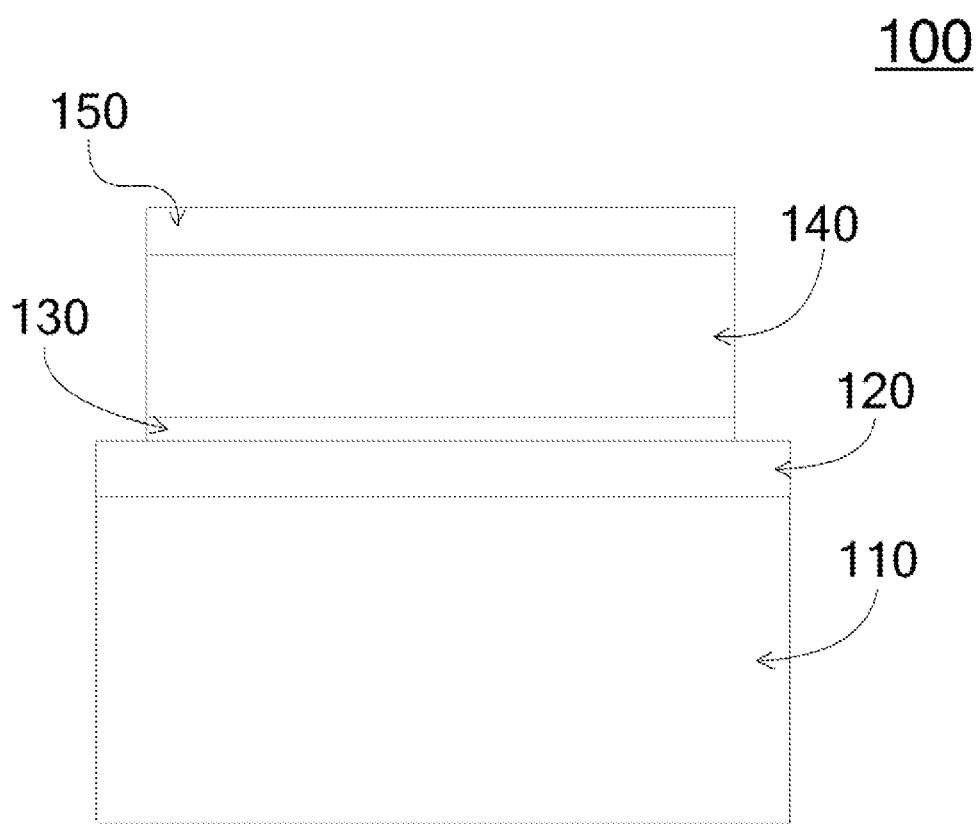
FIG. 1 is a structure diagram of a piezoelectric acoustic resonator with an adjustable temperature compensation capability provided in the embodiment 1 of the present invention.

The technical scheme in the embodiments of the present invention will be described clearly and completely in combination with the accompanying drawings in the embodiments of the present invention below. It should be noted that the embodiments in the present invention and the technical characteristics in the embodiments can be optionally combined with each other in the condition of no conflict.

The embodiments of the present invention provide a piezoelectric acoustic resonator with an adjustable temperature compensation capability. In the embodiments of the present invention, a temperature coefficient of sound velocity of a temperature compensation layer in a stacked structure of the resonator is controlled through a specific film deposition technique, and the temperature compensation layer that can adjust the temperature compensation capability is obtained; or a composite temperature compensation layer is placed in the stacked structure of the resonator, and by adjusting thicknesses of a film with a positive temperature coefficient of sound velocity and a film with a negative temperature coefficient of sound velocity in the composite layer, the temperature compensation layer that can adjust the temperature compensation capability is also obtained, which provides flexible parameters for designing the piezoelectric acoustic resonator having the temperature compensation layer.

The embodiments of the present invention provide a piezoelectric acoustic resonator with an adjustable temperature compensation capability, which comprises: a piezoelectric acoustic reflection structure, a first electrode, a second electrode and a piezoelectric layer between the first electrode and the second electrode; and the piezoelectric acoustic resonator further comprises: a temperature compensation layer; wherein the temperature compensation layer is a single-layer temperature compensation layer formed of a $Si_xO_y$ material, or a composite temperature compensation layer formed by stacking material with a positive temperature coefficient of sound velocity and material with a negative temperature coefficient of sound velocity; and the temperature compensation layer is configured to: perform reverse compensation for a temperature frequency shift caused by the first electrode, the piezoelectric layer and the second electrode in the piezoelectric acoustic resonator; wherein x:y is not equal to 1:2.

When the temperature compensation layer is the single-layer temperature compensation layer formed of the $Si_xO_y$ material, a temperature coefficient of sound velocity of the temperature compensation layer increases with an increase of an oxygen ratio in $Si_xO_y$, and decreases with an increase of a silicon ratio in $Si_xO_y$; and when the temperature compensation layer is the composite temperature compensation layer formed by stacking the material with the positive temperature coefficient of sound velocity and the material with the negative temperature coefficient of sound velocity, the temperature coefficient of sound velocity of the temperature compensation layer increases with an increase of thickness of the material with the positive temperature coefficient of sound velocity and decreases with an increase of thickness of the material with the negative temperature coefficient of sound velocity.

An arrangement mode of the temperature compensation layer is one of the following modes: the temperature compensation layer is arranged between the piezoelectric acoustic reflection structure and the first electrode; the temperature compensation layer is arranged between the first electrode and the piezoelectric layer; the temperature compensation layer is arranged between the piezoelectric layer and the second electrode; and the temperature compensation layer is arranged on the second electrode.

Alternatively, when the temperature compensation layer is the composite temperature compensation layer formed by stacking the material with the positive temperature coefficient of sound velocity and the material with the negative temperature coefficient of sound velocity, the material with the positive temperature coefficient of sound velocity in the temperature compensation layer is $SiO_2$, and the material with the negative temperature coefficient of sound velocity is dielectric or metal material.

Alternatively, the temperature compensation layer is made through a film deposition technique.

In conclusion, in the embodiments of the present invention, through the film deposition technique, in the process of making the piezoelectric acoustic resonator, the temperature coefficient of sound velocity of the materials of the temperature compensation layer is adjusted by adjusting the ratio of elements in the compensation materials, that is, the temperature compensation capability of the materials of the temperature compensation layer is changed; or with the composite temperature compensation layer formed by the film material with the positive temperature coefficient of sound velocity and the film material with the negative temperature coefficient of sound velocity, by adjusting thicknesses of two kinds of films, the temperature compensation layer that can adjust the temperature compensation capability also can be obtained, which provides flexible parameters for designing the piezoelectric acoustic resonator having the temperature compensation layer.

The apparatus according to the embodiments of the present invention will be elaborated through specific embodiments below.

Embodiment 1

As shown in FIG. 1, the embodiment of the present invention provides a piezoelectric acoustic resonator with an adjustable temperature compensation capability, and the piezoelectric acoustic resonator 100 comprises a piezoelectric acoustic reflection structure 110, a first electrode 120 located on the piezoelectric acoustic reflection structure 110, a temperature compensation layer 130 located on the first electrode 120, a piezoelectric layer 140 located on the temperature compensation layer 130, and a second electrode 150 located on the piezoelectric layer 140. The resonant frequency of the piezoelectric acoustic resonator 100 is co-determined by factors such as the thickness of each layer of materials forming the resonator and an acoustic velocity in each layer of materials and so on.

When the piezoelectric acoustic reflection structure 110 is an air-filled cavity, the piezoelectric acoustic resonator 100 is called an FBAR; and when the piezoelectric acoustic reflection structure 110 is a Bragg acoustic reflector formed by interleaving and overlapping a low acoustic impedance and a high acoustic impedance, the piezoelectric acoustic resonator 100 is called an SMR.

The first electrode 120 and the second electrode 150 can be formed of the same or different metal materials, and the metal materials can be Au, W, Mo, Pt, Ru, Ir, TiW, Al or Ti, or similar materials. The piezoelectric layer 140 can be formed of the following materials, such as AlN, ZnO, PZT, LiNbO3, KNbO3 or LiTaO3, but it is not limited to these materials.

The first electrode 120, the piezoelectric layer 140 and the second electrode 150 forming the piezoelectric acoustic resonator 100 have a negative temperature coefficient of sound velocity. When the temperature rises, the acoustic propagation velocity in the first electrode 120, the piezoelectric layer 140 and the second electrode 150 drops, and the resonant frequency of the resonator decreases. Therefore, a temperature coefficient of frequency of the piezoelectric acoustic resonator 100 without temperature compensation (without the temperature compensation layer 130) is negative. For example, in a piezoelectric acoustic resonator formed of an AlN layer and two Mo electrodes, if the thickness of the two Mo electrodes is greatly less than the thickness of the AlN, the temperature coefficient of frequency of the resonator is approximate to a temperature coefficient of sound velocity of the AlN, namely −25 ppm/° C. If the thickness of the Mo electrodes is approximate to the thickness of the AlN, a temperature coefficient of sound velocity of the Mo will be greatly contributed to the temperature coefficient of frequency of the piezoelectric acoustic resonator, and the TCF of the piezoelectric acoustic resonator is between −30 ppm/° C. and −40 ppm/° C. A thickness ratio of Mo to AlN in the resonator structure is greater, and the negative value of the TCF of the resonator is greater.

In order to compensate the change of resonant frequency of the resonator caused by the change of temperature, the temperature compensation layer 130 is added between the first electrode 120 and the piezoelectric layer 140, and the temperature compensation layer 130 adopts $Si_xO_y$ materials, and the temperature coefficient symbol of sound velocity thereof is opposite to that of the first electrode 120, the piezoelectric layer 140 and the second electrode 150, that is, it has a positive temperature coefficient of sound velocity. x:y is not equal to 1:2.

In the embodiment of the present invention, a silicon-oxygen atomic ratio of the silicon oxide temperature compensation layer 130 can be changed through the film deposition technique. With the chemical vapor deposition, by changing the flow velocity of reactant gas nitrous oxide ($N_2O$) and silicohydride ($SiH_4$), a silicon oxide film with different silicon-oxygen atomic ratios can be obtained.

In the embodiment of the present invention, when a ratio of x:y is changed, a temperature coefficient of sound velocity of $Si_xO_y$ is changed. If the ratio of x:y is smaller, that is, when the ratio of oxygen in the $Si_xO_y$ is greater, the temperature coefficient of sound velocity of the material is greater; if the ratio of x:y is greater, that is, when the ratio of silicon in the $Si_xO_y$ is greater, the temperature coefficient of sound velocity of the material is smaller or even turned into a negative. In conclusion, by changing the silicon-oxygen atomic ratio of $Si_xO_y$ of the temperature compensation layer through a specific film deposition technique, the temperature coefficient of sound velocity of the temperature compensation layer 130 can be changed, it is reflected in the piezoelectric acoustic resonator 100 that the temperature compensation capability of the temperature compensation layer 130 can be adjusted.

In the embodiment of the present invention, by adjusting the temperature compensation capability of the materials of the temperature compensation layer 130, more design variables can be provided for the piezoelectric acoustic resonator 100 having the temperature compensation layer 130, so that the process of designing a resonator has a stronger flexibility.

Figure 2:
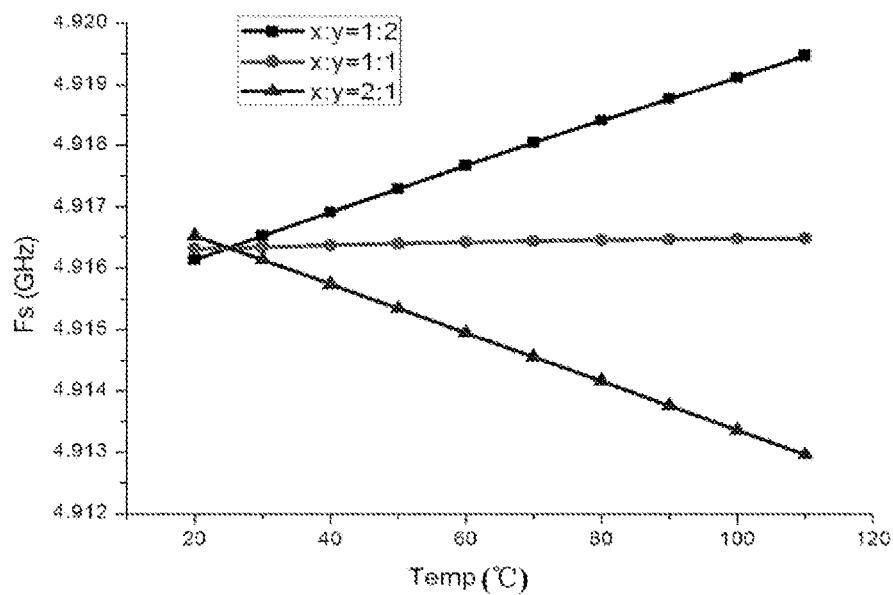
FIG. 2 is a frequency-temperature curve of the piezoelectric acoustic resonator under different x:y ratios in the embodiment 1 of the present invention.

As shown in FIG. 2, it is a frequency-temperature curve of the piezoelectric acoustic resonator 100 obtained by using the scheme of the embodiment of the present invention, the difference between piezoelectric acoustic resonators represented by all the curves only lies in the silicon-oxygen atomic ratio in the temperature compensation layer 130. The material of the piezoelectric layer is AlN, the first electrode and the second electrode are Mo. When the silicon-oxygen atomic ratio x:y of the temperature compensation layer 130 is equal to 1:2, a temperature coefficient of frequency of the piezoelectric acoustic resonator is +9 ppm/° C.; when the silicon-oxygen atomic ratio x:y is equal to 1:1, the temperature coefficient of frequency of the piezoelectric acoustic resonator is 0 ppm/° C.; and when the silicon-oxygen atomic ratio x:y is equal to 2:1, the temperature coefficient of frequency of the piezoelectric acoustic resonator is −8 ppm/° C.; therefore, the temperature coefficient of frequency of the piezoelectric acoustic resonator can be accurately controlled within a certain range by using such special $SiO_2$ film deposition technique. It should be noted that, the temperature compensation layer 130 in the embodiment of the present invention does not adopt a ratio that the silicon-oxygen atomic ratio x:y=1:2, and the "silicon-oxygen atomic ratio x:y=1:2" mentioned in FIG. 2 is only used as a comparison curve in the embodiment of the present invention.

Embodiment 2

Figure 3:
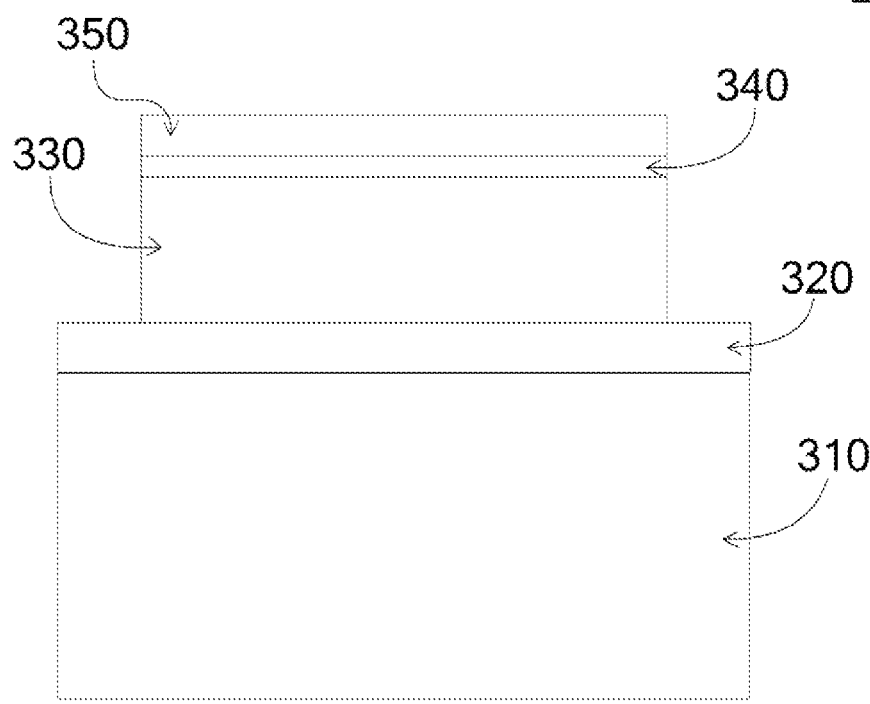
FIG. 3 is a structure diagram of a piezoelectric acoustic resonator with an adjustable temperature compensation capability provided in the embodiment 2 of the present invention.

As shown in FIG. 3, it is a piezoelectric acoustic resonator with an adjustable temperature compensation capability provided in the embodiment of the present invention, and in this typical embodiment, a piezoelectric acoustic resonator 300 includes a piezoelectric acoustic reflection structure 310, a first electrode 320 located on the piezoelectric acoustic reflection structure 310, a piezoelectric layer 330 located on the first electrode 320, a temperature compensation layer 340 located on the piezoelectric layer 330, and a second electrode 350 located on the temperature compensation layer 340. The temperature compensation layer 340 adopts $Si_xO_y$ materials, and x:y is not equal to 1:2.

In the embodiment of the present invention, the first electrode 320 and the second electrode 350 can be formed of the same or different metal materials, and the metal materials can be Au, W, Mo, Pt, Ru, Ir, TiW, Al or Ti, or similar materials. The piezoelectric layer 330 can be formed of the following materials, such as AlN, ZnO, PZT, LiNbO3, KNbO3 or LiTaO3, but it is not limited to these materials.

Embodiment 3

Figure 4:
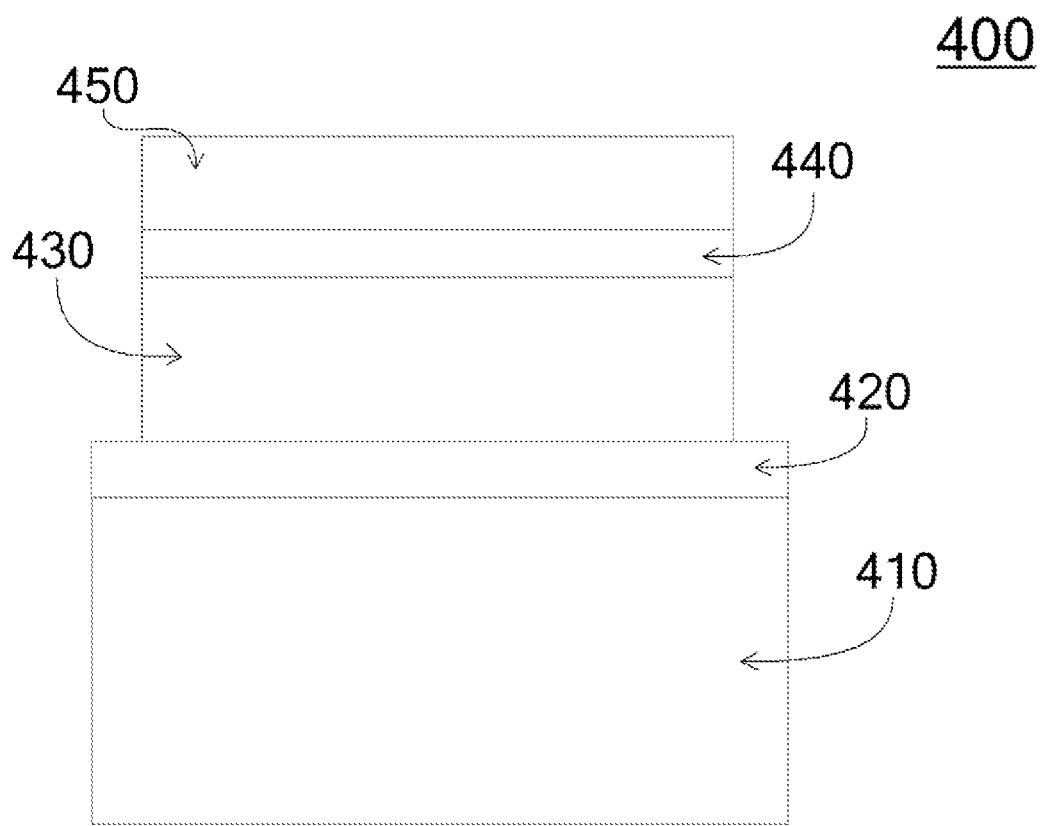
FIG. 4 is a structure diagram of a piezoelectric acoustic resonator with an adjustable temperature compensation capability provided in the embodiment 3 of the present invention.

As shown in FIG. 4, it is a piezoelectric acoustic resonator with an adjustable temperature compensation capability provided in the embodiment of the present invention, and in this typical embodiment, a piezoelectric acoustic resonator 400 includes a piezoelectric acoustic reflection structure 410, a first electrode 420 located on the piezoelectric acoustic reflection structure 410, a piezoelectric layer 430 located on the first electrode 420, a second electrode 440 located on the piezoelectric layer 430, and a temperature compensation layer 450 located on the second electrode 440. The temperature compensation layer 450 adopts $Si_xO_y$ materials, and x:y is not equal to 1:2.

In the embodiment of the present invention, the first electrode 420 and the second electrode 440 can be formed of the same or different metal materials, and the metal materials can be Au, W, Mo, Pt, Ru, Ir, TiW, Al or Ti, or similar materials. The piezoelectric layer 430 can be formed of the following materials, such as AlN, ZnO, PZT, LiNbO3, KNbO3 or LiTaO3, but it is not limited to these materials.

Embodiment 4

Figure 5:
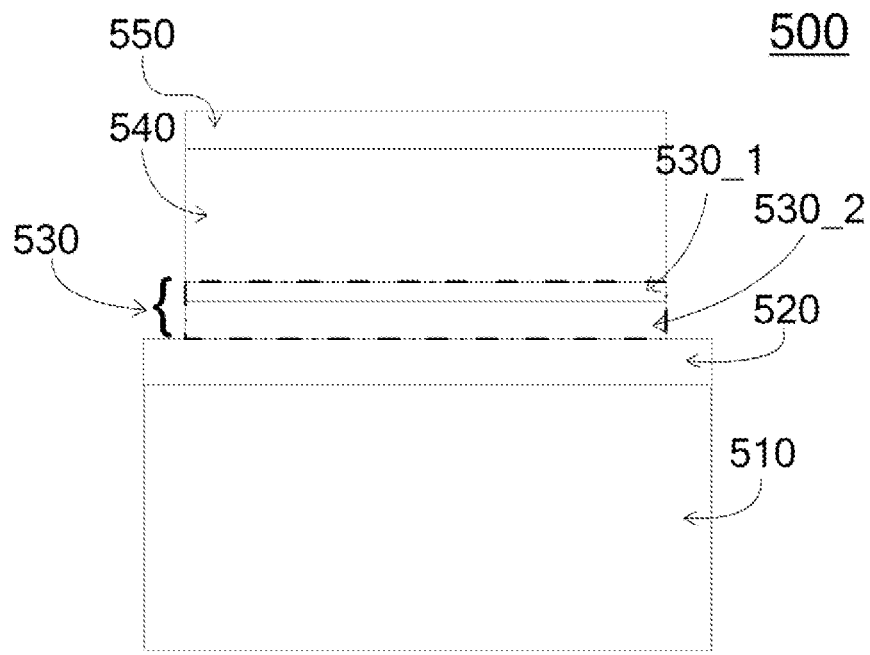
FIG. 5 is a structure diagram of a piezoelectric acoustic resonator with an adjustable temperature compensation capability provided in the embodiment 4 of the present invention.

As shown in FIG. 5, it is a piezoelectric acoustic resonator with an adjustable temperature compensation capability provided in the embodiment of the present invention, and in this typical embodiment, a piezoelectric acoustic resonator 500 includes a piezoelectric acoustic reflection structure 510, a first electrode 520 located on the piezoelectric acoustic reflection structure 510, a composite temperature compensation layer 530 located on the first electrode 520, a piezoelectric layer 540 located on the composite temperature compensation layer 530, and a second electrode 550 located on the piezoelectric layer 540. The resonant frequency of the piezoelectric acoustic resonator 500 is co-determined by factors such as the thickness of each layer of materials forming the resonator and an acoustic velocity in each layer of materials and so on.

The first electrode 520 and the second electrode 550 can be formed of the same or different metal materials, and the metal materials can be Au, W, Mo, Pt, Ru, Ir, TiW, Al or Ti, or similar materials. The piezoelectric layer 540 can be formed of the following materials, such as AlN, ZnO, PZT, LiNbO3, KNbO3 or LiTaO3, but it is not limited to these materials.

In the embodiment of the present invention, the first electrode 520, the piezoelectric layer 540 and the second electrode 550 forming the piezoelectric acoustic resonator 500 have a negative temperature coefficient of sound velocity. When the temperature rises, the acoustic propagation velocity in the first electrode 520, the piezoelectric layer 540 and the second electrode 550 drops, and the resonant frequency of the resonator decreases. In order to compensate the change of resonant frequency of the resonator caused by the change of temperature, the composite temperature compensation layer 530 is added between the first electrode 520 and the piezoelectric layer 540. The composite temperature compensation layer 530 includes a material layer 530_1 and a material layer 530_2, and one layer is a material layer with a positive temperature coefficient of sound velocity, and the other layer is a material layer with a negative temperature coefficient of sound velocity; wherein if 530_1 is the material layer with the positive temperature coefficient of sound velocity, 530_2 is the material layer with the negative temperature coefficient of sound velocity, and if the 530_1 is the material layer with the negative temperature coefficient of sound velocity, 530_2 is the material layer with the positive temperature coefficient of sound velocity. Alternatively, the material with the positive temperature coefficient of sound velocity in the composite temperature compensation layer 530 is $SiO_2$, and the material with the negative temperature coefficient of sound velocity can be dielectric or metal material.

In the composite temperature compensation layer 530, it is assumed that 530_1 has the positive temperature coefficient of sound velocity and 530_2 has the negative temperature coefficient of sound velocity, and if a thickness ratio of 530_1 to 530_2 increases, a temperature coefficient of frequency of the piezoelectric resonator 500 is changing in a positive direction, and if the thickness ratio of 530_1 to 530_2 decreases, the temperature coefficient of frequency of the piezoelectric resonator 500 is changing in a negative direction. Therefore, by changing a thickness ratio of the material layer with the positive temperature coefficient of sound velocity to the material layer with the negative temperature coefficient of sound velocity in the composite temperature compensation layer 530, the temperature coefficient of sound velocity of the composite temperature compensation layer 530 can be changed, it is reflected in the piezoelectric acoustic resonator 500 that the temperature compensation capability of the temperature compensation layer 530 can be adjusted.

By adjusting the temperature compensation capability of the materials of the composite temperature compensation layer 530, more design variables can be provided for the piezoelectric acoustic resonator 500 having the composite temperature compensation layer 530, so that the process of designing a resonator has a stronger flexibility.

Figure 6:
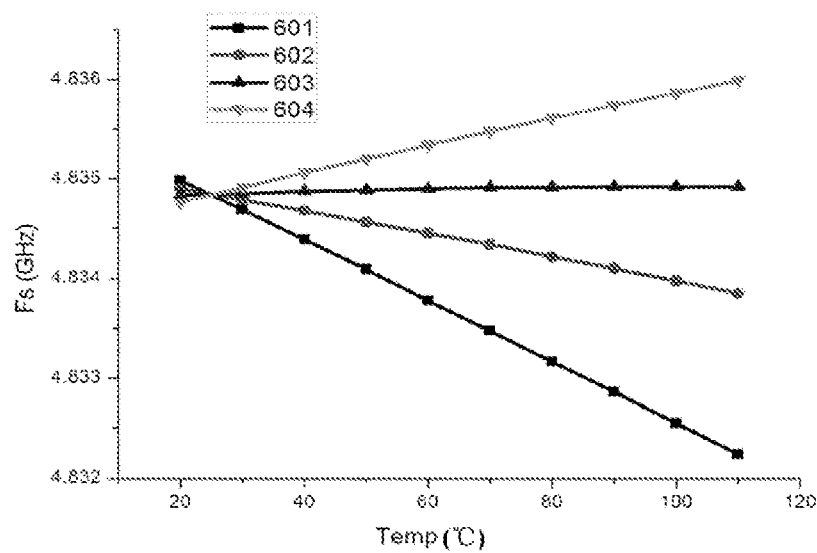
FIG. 6 is a frequency-temperature curve of the piezoelectric acoustic resonator having the composite temperature compensation layer in the embodiment 4 of the present invention.

As shown in FIG. 6, FIG. 6 is a frequency-temperature curve of the piezoelectric acoustic resonator 500, and the difference between piezoelectric acoustic resonators represented by all the curves only lies in a thickness ratio of a film with the positive temperature coefficient of sound velocity to a film with the negative temperature coefficient of sound velocity in the composite temperature compensation layer 530, and curves 601 to 604 represent that the thickness ratio of the film with the positive temperature coefficient of sound velocity to the film with the negative temperature coefficient of sound velocity gradually increases. When the temperature is 25° C., resonant frequencies of all the piezoelectric acoustic resonators are equal or approximate. The material of the piezoelectric layer of the piezoelectric acoustic resonator is AlN, the materials of the first electrode and the second electrode are Mo. In the composite temperature compensation layer 530, the material with the negative temperature coefficient of sound velocity is silicon nitride (SiN), and the material with the positive temperature coefficient of sound velocity is $SiO_2$.

Embodiment 5

Figure 7:
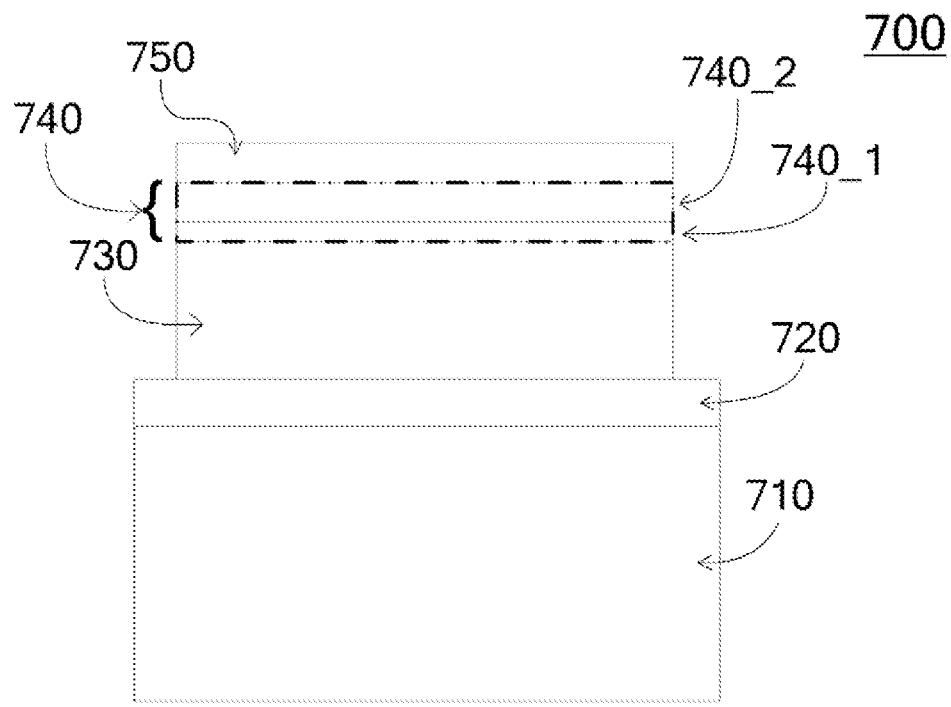
FIG. 7 is a structure diagram of a piezoelectric acoustic resonator with an adjustable temperature compensation capability provided in the embodiment 5 of the present invention.

As shown in FIG. 7, it is a piezoelectric acoustic resonator with an adjustable temperature compensation capability provided in the embodiment of the present invention, and the difference between the piezoelectric acoustic resonator and the piezoelectric acoustic resonator shown in FIG. 5 lies in the position of the composite temperature compensation layer in the stacked structure of the resonator. A piezoelectric acoustic resonator 700 includes a piezoelectric acoustic reflection structure 710, a first electrode 720 located on the piezoelectric acoustic reflection structure 710, a piezoelectric layer 730 located on the first electrode 720, a composite temperature compensation layer 740 located on the piezoelectric layer 730, and a second electrode 750 located on the composite temperature compensation layer 740.

Embodiment 6

Figure 8:
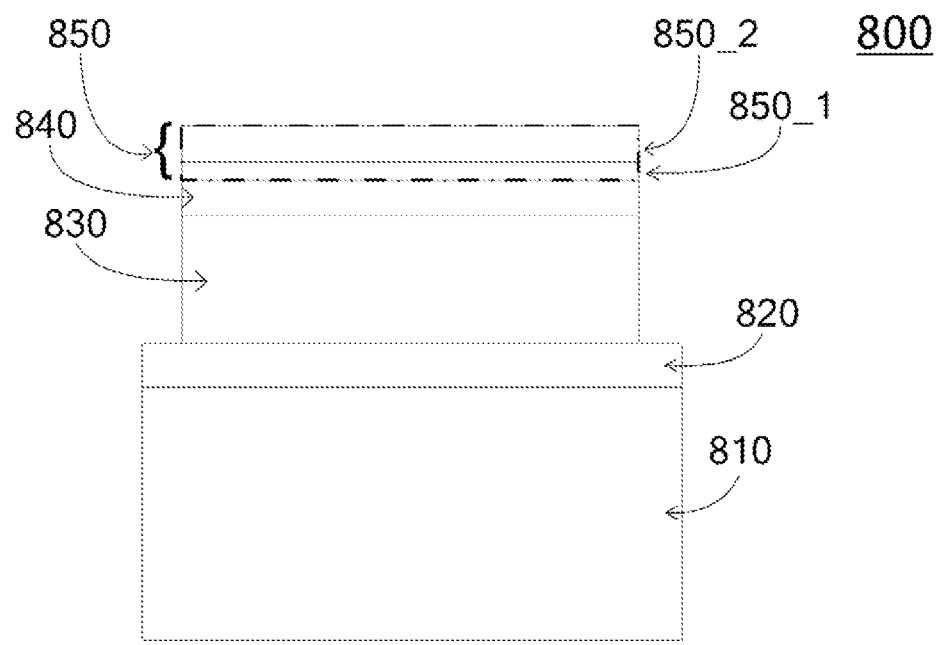
FIG. 8 is a structure diagram of a piezoelectric acoustic resonator with an adjustable temperature compensation capability provided in the embodiment 6 of the present invention.

As shown in FIG. 8, it is a piezoelectric acoustic resonator with an adjustable temperature compensation capability provided in the embodiment of the present invention, and the difference between the piezoelectric acoustic resonator and the piezoelectric acoustic resonator shown in FIG. 5 lies in the position of the composite temperature compensation layer in the stacked structure of the resonator. A piezoelectric acoustic resonator 800 includes a piezoelectric acoustic reflection structure 810, a first electrode 820 located on the piezoelectric acoustic reflection structure 810, a piezoelectric layer 830 located on the first electrode 820, a second electrode 840 located on the piezoelectric layer 830, and a composite temperature compensation layer 850 located on the second electrode 840.

It can be seen that, in the embodiment of the present invention, by adjusting the temperature compensation capability of the materials of the temperature compensation layer, more design variables can be provided for the piezoelectric acoustic resonator having the temperature compensation layer, so that the process of designing a resonator has a stronger flexibility; or, in the embodiment of the present invention, by adjusting the temperature compensation capability of the materials of the composite temperature compensation layer, more design variables can be provided for the piezoelectric acoustic resonator having the composite temperature compensation layer, so that the process of designing a resonator has a stronger flexibility.

Apparently, those skilled in the art can make various modifications and variations for the embodiment of the present invention without departing from the spirit and scope of the present document. Therefore, if these modifications and variations of the embodiment of the present invention belong to the scope of the claims of the present document and the equivalent techniques thereof, the present document also intends to include these modifications and variations.

INDUSTRIAL APPLICABILITY

In the embodiments of the present invention, by adjusting the temperature coefficient of sound velocity of the materials of the temperature compensation layer, or with the method for adjusting the temperature compensation capability of the materials of the temperature compensation layer through the composite temperature compensation layer formed by stacking the material with the positive temperature coefficient of sound velocity and the material with the negative temperature coefficient of sound velocity, it makes the process of designing a resonator have a stronger flexibility.

What is claimed is:

1. A piezoelectric acoustic resonator with an adjustable temperature compensation capability, comprising: a piezoelectric acoustic reflection structure, a first electrode, a second electrode, a piezoelectric layer between the first electrode and the second electrode, and a temperature compensation layer; wherein the temperature compensation layer is a single-layer temperature compensation layer formed of $Si_xO_y$ material, or a composite temperature compensation layer formed by stacking material with a positive temperature coefficient of sound velocity and material with a negative temperature coefficient of sound velocity;

the temperature compensation layer is configured to: perform reverse compensation for a temperature frequency shift caused by the first electrode, the piezoelectric layer and the second electrode in the piezoelectric acoustic resonator; wherein x:y is not equal to 1:2;

wherein when the temperature compensation layer is the single-layer temperature compensation layer formed of the $Si_xO_y$ material, a temperature coefficient of sound velocity of the single-layer temperature compensation layer increases with an increase of an oxygen ratio in $Si_xO_y$ and decreases with an increase of a silicon ratio in the $Si_xO_y$; and when the temperature compensation layer is the composite temperature compensation layer formed by stacking the material with the positive temperature coefficient of sound velocity and the material with the negative temperature coefficient of sound velocity, the temperature coefficient of sound velocity of the composite temperature compensation layer increases with an increase of thickness of the material with the positive temperature coefficient of sound velocity and decreases with an increase of thickness of the material with the negative temperature coefficient of sound velocity.

2. The piezoelectric acoustic resonator according to claim 1, wherein when the temperature compensation layer is the composite temperature compensation layer formed by stacking the material with the positive temperature coefficient of sound velocity and the material with the negative temperature coefficient of sound velocity, the material with the positive temperature coefficient of sound velocity in the temperature compensation layer is $SiO_2$, and the material with the negative temperature coefficient of sound velocity is dielectric or metal material.

3. The piezoelectric acoustic resonator according to claim 1, wherein an arrangement mode of the temperature compensation layer is one of the following modes:

the temperature compensation layer is arranged between the piezoelectric acoustic reflection structure and the first electrode;

the temperature compensation layer is arranged between the first electrode and the piezoelectric layer;

the temperature compensation layer is arranged between the piezoelectric layer and the second electrode; and the temperature compensation layer is arranged on the second electrode.

4. The piezoelectric acoustic resonator according to claim 1, wherein the temperature compensation layer is made through a film deposition technique.

5. The piezoelectric acoustic resonator according to claim 1, wherein the first electrode and the second electrode use the same or different metal materials;

the metal materials comprise: Au, W, Mo, Pt, Ru, Ir, TiW, Al or Ti.

6. The piezoelectric acoustic resonator according to claim 1, wherein the piezoelectric layer adopts one of the following materials: aluminum nitride (AlN), zinc oxide (ZnO), piezoelectric ceramics (PZT), lithium niobate (LiNbO3), potassium niobate (KNbO3) or lithium tantalate (LiTaO3).

7. The piezoelectric acoustic resonator according to claim 2, wherein an arrangement mode of the temperature compensation layer is one of the following modes:

the temperature compensation layer is arranged between the piezoelectric acoustic reflection structure and the first electrode;

the temperature compensation layer is arranged between the first electrode and the piezoelectric layer;

the temperature compensation layer is arranged between the piezoelectric layer and the second electrode; and the temperature compensation layer is arranged on the second electrode.

8. The piezoelectric acoustic resonator according to claim 2, wherein the temperature compensation layer is made through a film deposition technique.

\* \* \* \* \*